United States Patent
Polley et al.

(10) Patent No.: US 10,001,529 B2
(45) Date of Patent: Jun. 19, 2018

(54) LOW-OFFSET GRAPHENE HALL SENSOR

(71) Applicant: Texas Instruments Incorporated, Dallas, TX (US)

(72) Inventors: Arup Polley, Richardson, TX (US); Archana Venugopal, Dallas, TX (US); Luigi Colombo, Dallas, TX (US); Robert R. Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 59 days.

(21) Appl. No.: 14/936,631

(22) Filed: Nov. 9, 2015

(65) Prior Publication Data

US 2017/0067970 A1     Mar. 9, 2017

Related U.S. Application Data

(60) Provisional application No. 62/213,862, filed on Sep. 3, 2015.

(51) Int. Cl.
  *G01R 33/07*   (2006.01)
  *H01L 43/04*   (2006.01)
  (Continued)

(52) U.S. Cl.
  CPC ......... *G01R 33/07* (2013.01); *G01R 33/0041* (2013.01); *G01R 33/075* (2013.01);
  (Continued)

(58) Field of Classification Search
  CPC .................................................... G01R 33/07
  (Continued)

(56) References Cited

U.S. PATENT DOCUMENTS 3,448,353 A * 6/1969 Gallahger et al.
5,307,072 A * 4/1994 Jones, Jr. .................. F41G 3/08
                                                       324/244

(Continued)

FOREIGN PATENT DOCUMENTS

WO       2013009961 A1    1/2013

OTHER PUBLICATIONS

Arup Polley, "Low Noise Graphene Hall Sensors, Systems, and Methods of Making and Using Same", U.S. Appl. No. 14/676,233, filed Apr. 1, 2015.

(Continued)

*Primary Examiner* — Walter L Lindsay, Jr.
*Assistant Examiner* — Milton Gonzalez
(74) *Attorney, Agent, or Firm* — Michael A. Davis, Jr.; Charles A. Brill; Frank D. Cimino

(57) ABSTRACT

A Graphene Hall sensor (GHS) is provided with a modulated gate bias signal in which the modulated gate bias signal alternates at a modulation frequency between a first voltage that produces a first conductivity state in the GHS and a second voltage that produces approximately a same second conductivity state in the GHS. A bias current is provided through a first axis of the GHS. A resultant output voltage signal is provided across a second axis of the Hall sensor that includes a modulated Hall voltage and an offset voltage, in which the Hall voltage is modulated at the modulation frequency. An amplitude of the Hall voltage that does not include the offset voltage is extracted from the resultant output voltage signal.

20 Claims, 10 Drawing Sheets

(51) Int. Cl.
*H01L 43/06* (2006.01)
*H01L 43/10* (2006.01)
*G01R 33/00* (2006.01)

(52) U.S. Cl.
CPC .............. *H01L 43/04* (2013.01); *H01L 43/06* (2013.01); *H01L 43/10* (2013.01)

(58) Field of Classification Search
USPC ........................................................ 324/251
See application file for complete search history.

(56) References Cited

U.S. PATENT DOCUMENTS

| | | | |
|---|---|---|---|
| 6,529,845 B1* | 3/2003 | Beck, II | |
| 7,049,812 B2* | 5/2006 | Hara | G01R 33/07 324/251 |
| 7,358,880 B1* | 4/2008 | Melanson | G01D 5/145 341/143 |
| 2005/0067629 A1* | 3/2005 | Woodall | C30B 23/02 257/101 |
| 2007/0046287 A1* | 3/2007 | Vervaeke | G01R 33/0094 324/251 |
| 2009/0137066 A1* | 5/2009 | Imai | |
| 2009/0140801 A1* | 6/2009 | Ozyilmaz | |
| 2009/0198351 A1* | 8/2009 | Kitagawa | |
| 2010/0117855 A1* | 5/2010 | Sinclair | |
| 2011/0175628 A1* | 7/2011 | Kohlstedt | B82Y 10/00 324/649 |
| 2012/0025817 A1* | 2/2012 | Romero | G01R 33/0029 324/251 |
| 2014/0008611 A1 | 1/2014 | Geim et al. | |
| 2014/0197459 A1 | 7/2014 | Kis et al. | |
| 2015/0102807 A1 | 4/2015 | Eckinger et al. | |
| 2016/0293834 A1 | 10/2016 | Polley et al. | |

OTHER PUBLICATIONS

"Hall Effect", Wikipedia, available at https://en.wikipedia.org/wiki/Hall_effect on Oct. 13, 2015, pp. 1-10.

"Sensor Signal Conditioning IC for Closed-Loop Magnetic Current Sensors", DRV411, SBOS693B, Texas Instruments, Inc., Aug. 2013, revised Dec. 2013, pp. 1-34.

Wenjun Liu, et al, "A Study on Graphene-Metal Contact", Journal, Mar. 18, 2013 Crystals 2013, 3, pp. 257-274.

Katsnelson et al. "Chiral tunneling and the Klein paradox in graphene", Nature Physics 2, 620-625 (2006).

International Search Report for PCT/US2016/050414 dated Dec. 15, 2016.

* cited by examiner

LOW-OFFSET GRAPHENE HALL SENSOR

CLAIM OF PRIORITY UNDER 35 U.S.C. 119 ((A) FOREIGN, (E) PROVISIONAL)

The present application claims priority to and incorporates by reference U.S. Provisional Application No. 62/213,862, filed Sep. 3, 2015, entitled "Low Noise Graphene Hall Sensor."

FIELD OF THE INVENTION

This disclosure relates to Hall Effect devices, and in particular to Graphene Hall sensors.

BACKGROUND OF THE INVENTION

Hall Sensors are the industry choice for medium sensitivity magnetic sensors due to low cost, small area, and easy integrability. However, all semiconductor Hall sensors suffer from offset resulting from nonidealities such as mismatch, doping variations, and undesired piezoelectric effects. A technique referred to as "spinning current" partially reduces the offset at the expense of severe bandwidth degradation. Even the residual offset is large enough to limit accuracy in most of the application. Moreover, the residual offset drifts depending on factors such as temperature, packaging, stress, variation, and aging.

The so called "Hall Effect" occurs when a magnetic field is oriented perpendicular to an electric current. The magnetic field generates a voltage difference across a conductor, called the Hall Voltage, in a direction which is perpendicular to both the direction of the magnetic field and the direction of the current flow. By measuring the Hall Voltage it is possible to determine the size of the component of the magnetic field. Typical Hall sensors usually include a strip or plate of an electrically conductive material with an electric current flowing through the plate. When the plate is positioned in a magnetic field such that a component of the field is perpendicular to the plate, a Hall Voltage is generated within the plate in a direction that is perpendicular to both the direction of the magnetic field and the direction of the current flow.

Semiconductor Hall Effect sensors produced using current techniques typically include a sensing element produced from silicon. The magnetic sensitivity of these devices is directly related to, and limited by, the electron mobility, mu, of the material used to construct the sensing element. Silicon typically has an electron mobility of approximately 1500 $cm^2/(Vs)$. Graphene, by contrast, may have an electron mobility in the range of 4500-40,000 $cm^2/(Vs)$. Consequently, a Hall Effect device employing a sensing element constructed from graphene will have a much higher magnetic sensitivity than a typical silicon based device.

Hall sensors using graphene as the channel are expected to provide good noise performance, depending on the achieved mobility. However, Graphene Hall sensors also suffer from the same offset problem of semiconductor Hall devices.

BRIEF DESCRIPTION OF THE DRAWINGS

Particular embodiments in accordance with the invention will now be described, by way of example only, and with reference to the accompanying drawings.

Figure 1:
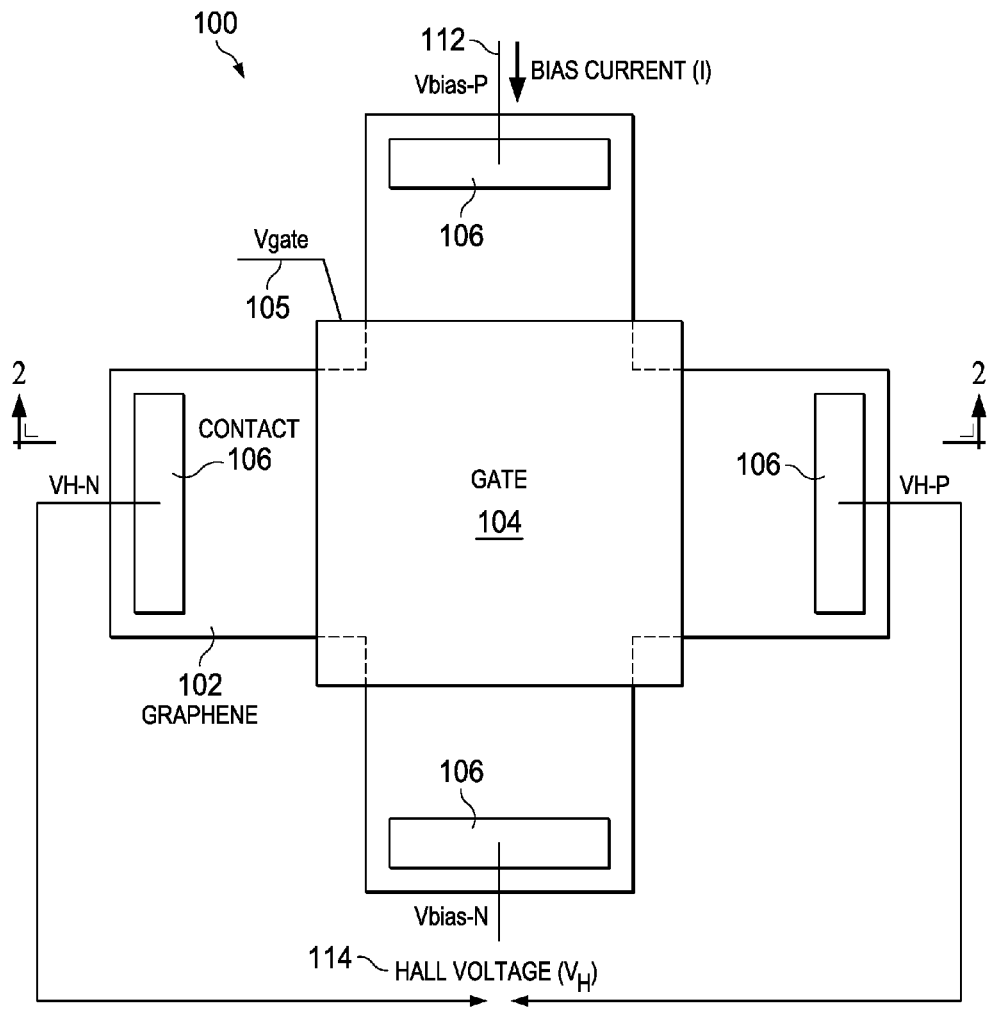
FIG. 1 is an illustration of an exemplary a Graphene Hall sensor (GHS) device.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Embodiments of this disclosure provide an architecture and method that may mitigate the offset in graphene Hall devices using unique properties of a gate controlled graphene channel in a Graphene Hall Sensor (GHS). Unlike a conventional Hall sensor, a GHS requires a gate bias to control the conducting graphene channel. Graphene is an allotrope of carbon in the form of a two-dimensional, atomic-scale, hexagonal lattice in which one atom forms each vertex. Graphene has several unique properties relating to conductivity and Hall sensitivity. Conductivity is an even function of gate voltage around the Dirac point, whereas, Hall sensitivity is an odd function of gate voltage.

A solution to reduce offset typical in a GHS that will be disclosed in more detail herein is to modulate the gate with a high frequency control voltage such that the Hall output voltage is also modulated with the high frequency but the offset stays at DC. The output voltage may then be demodulated after amplification to obtain the sensor signal. This may also eliminate the effect of offset and offset drift in the electronic amplifier. Gate modulation may be done at a much higher frequency compared to the typical spinning current frequency and thus a much higher bandwidth is achievable.

The method disclosed herein is completely different from the spinning current technique (SCT) method typically used in Hall sensors. It relies on the unique ambipolar properties of Graphene. It also depends on Klein tunneling in Graphene which allows current through p-n or n-p junctions in Graphene. The solution disclosed herein provides much lower offset, offset drift and higher bandwidth compared to a semiconductor Hall sensor.

Figure 2:
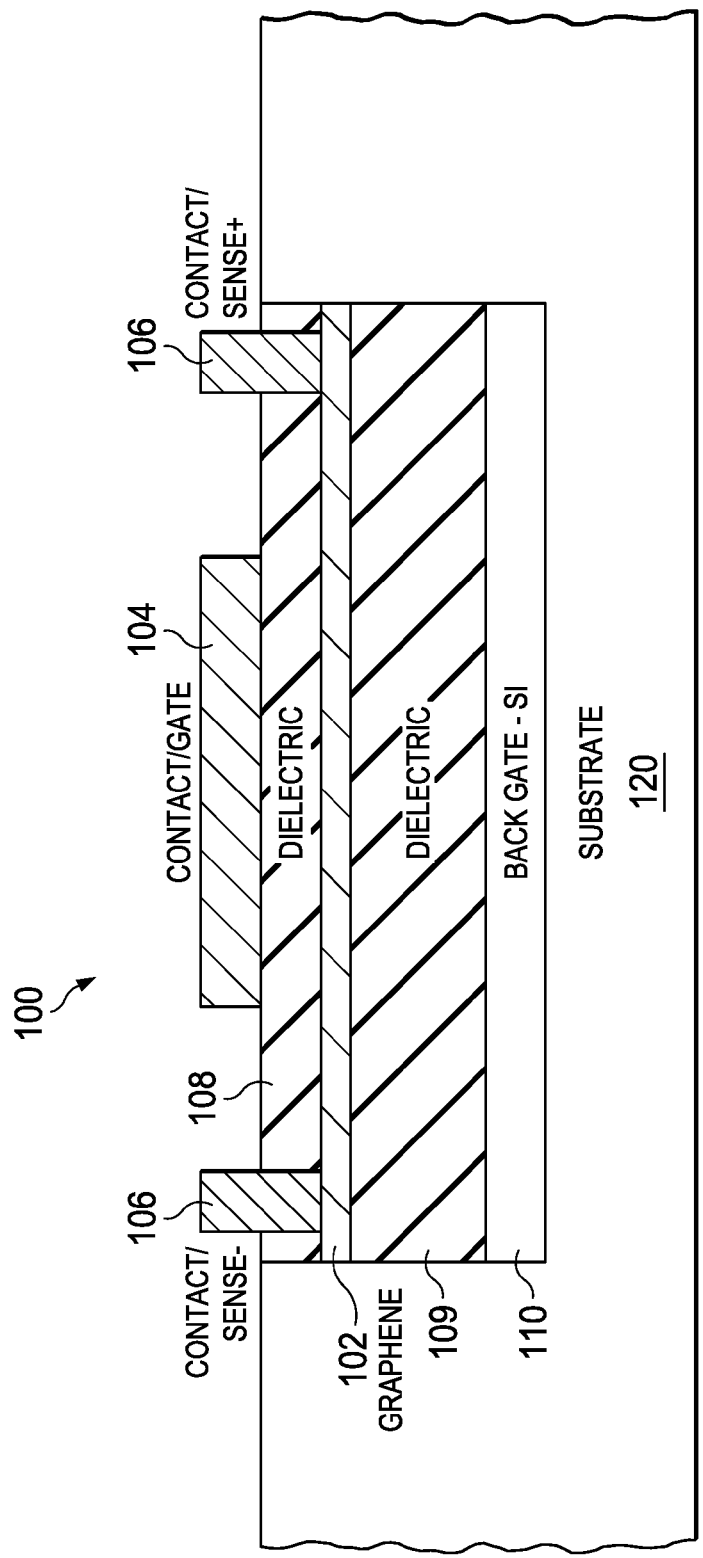
FIG. 2 is a side view of the GHS of FIG. 1.

FIG. 1 is an illustration of an exemplary Graphene Hall sensor device 100. FIG. 2 is a side view of GHS 100. The general concept of Hall sensor is well known and need not be described in detail herein. As mentioned above, the "Hall Effect" occurs when a magnetic field is oriented perpendicular to an electric current. The magnetic field generates a voltage difference across a conductor, called the Hall Voltage, in a direction which is perpendicular to both the direction of the magnetic field and the direction of the current flow. By measuring the Hall Voltage it is possible to determine the size of the component of the magnetic field.

In this example, Hall sensor 100 is fabricated on a substrate 120 using known or later developed fabrication techniques. A back gate 110 may be formed in the substrate 120 by doping a well region. A dielectric 109 may be formed in the back gate 110. A layer of graphene 102 is formed on dielectric 109 and then another layer of dielectric 108 is formed over the graphene layer. A conductive gate 104 may be formed on top of dielectric layer 108. Contact regions 106 are formed in contact with the graphene layer in order to provide a bias current 112 through the graphene layer and to sense a resulting Hall Effect voltage 114.

Graphene element 102 may be patterned into a traditional cross shape, as illustrated in FIG. 1. In other embodiments, other graphene element shapes may be patterned, such as an octagon or substantially octagonal, a triangle or substantially triangular, a quatrefoil or substantially quatrefoil shaped, a circle or substantially circular shape, etc. Similarly, depending on the geometry of graphene layer 102, the number of contact pads 106 and corresponding wires may be altered to fit a given application.

In this embodiment, conductive gate 104 covers the channel region of the graphene, but not the contact regions 106. This configuration allows the gate to be used to modulate the channel region without affecting the contact resistance of contact regions 106.

Figure 3:
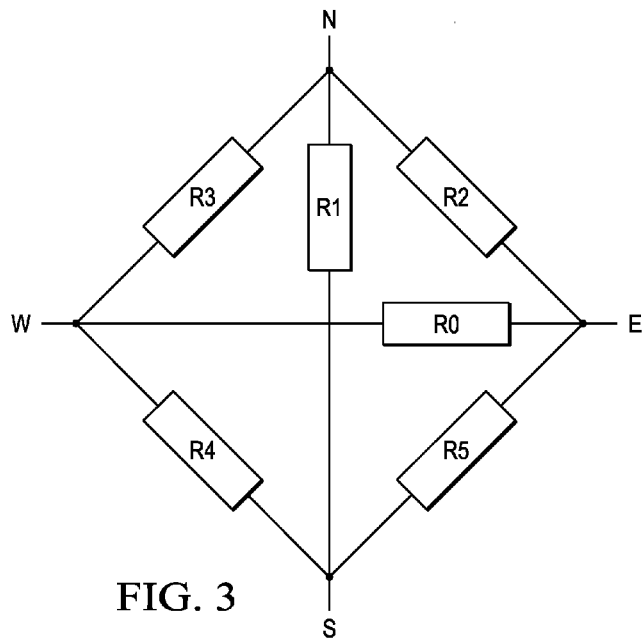
FIG. 3 is an equivalent electrical model of a Hall sensor

FIG. 3 is an equivalent electrical model of a typical semiconductor Hall Sensor. In this model, assume the bias current is injected at port N and removed at port S, and the Hall voltage is measured across ports W and E. There is an effective channel resistance R1 to the bias current, and a channel resistance R0 in the Hall voltage path. There is also a Wheatstone bridge resistance effect represented by resistors R2-R5. There is typically a large offset due to resistor mismatch in the Wheatstone bridge type electrical model that is unavoidable even with the state-of-the-art lithography and fabrication processes. Each and all of these resistance effects may vary over time and temperature to contribute to the offset voltage drift. GHS also demonstrates these effects as is illustrated in Petruk et al. "Sensitivity and Offset Voltage Testing in the Hall-Effect Sensors Made of Graphene" Springer 2014, pp 631.

Figure 4:
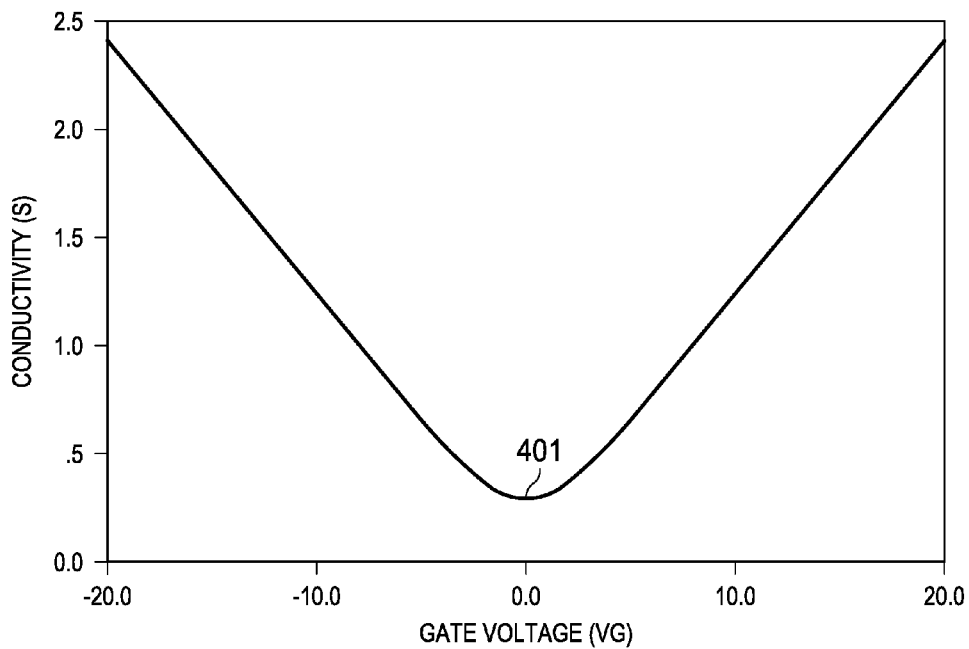
FIG. 4 is a plot illustrating Graphene channel conductivity as a function of gate voltage.

FIG. 4 is a plot illustrating Graphene channel conductivity (Siemens (S)) as a function of gate voltage (Vgate) 105 in an exemplary GHS device. In this example, the Graphene mobility is 10,000 cm$^2$/Vs, capacitance of the gate oxide (Cox) is 0.12 fF/mm$^2$, the Hall element is square, and the contact resistance is 100Ω. Other configurations of GHS will have a similar channel conductivity characteristic.

Gate voltage induces carriers (electron or hole) in the Graphene channel. Conductivity (σ) depends on carrier concentration (n) & mobility (μ), as represented by expression (1).

$$\sigma = q n \mu \quad (1)$$

A property of Graphene is that electrons and holes conduct with equal mobility. This results in the conductivity being an even function of gate voltage around Dirac point 401.

Figure 5:
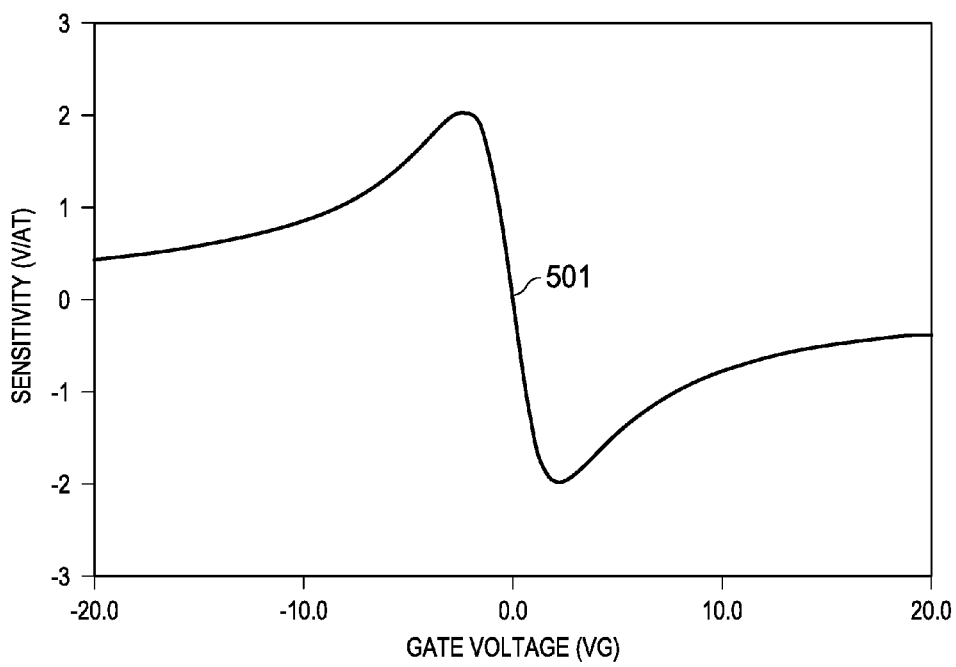
FIG. 5 is a plot illustrating Graphene current-related sensitivity as a function of gate voltage.

FIG. 5 is a plot illustrating Hall sensitivity (volt/amp·Tesla (V/AT)) vs. gate voltage that illustrates Graphene's current-related sensitivity as a function of gate voltage. The Hall sensitivity in Graphene depends on both electron (n) and hole (p) surface density in response to gate voltage, which results in an odd function around the Dirac point 501. Hall sensitivity in Graphene is illustrated by expression (2).

$$S_I = \frac{V_H}{B I_{dias}} = \frac{(\mu_h^2 n_h - \mu_e^2 n_e)}{q(\mu_h n_h + \mu_e n_e)^2} \approx \frac{(n_h - n_e)}{q(n_h + n_e)^2} \quad (2)$$

There is no backscattering of carriers (both electron and holes) at a PN junction due to the known effects of Chiral tunneling and the Klein paradox; therefore a Graphene PN junction does not work as a diode for normal incidence. Carriers flow unimpeded in a Graphene PN junction. Graphene contact and channel may be differently doped (N or P types) and current can flow from P to N or N to P without any increased resistance, see, e.g. "Chiral tunneling and the Klein paradox in graphene", Katsnelson et al.

Referring back to FIG. 2, a GHS may have both a top gate 104 and a back gate 110. In other embodiments, only one or the other gate may be implemented. This dual gate GHS configuration provides two controls to change channel carrier concentration. The top gate changes carrier concentration only in the channel region. Typically, the oxide layer that forms dielectric 108 is thinner than layer 109, and there is a resulting larger capacitance density for the top gate structure with the Graphene layer 102. The back gate underlies both the channel region and the contact region and may therefore affect the carrier concentration at the contact regions 106 and thereby modify contact resistance. Typically, the oxide layer that forms dielectric 109 is thicker than layer 108, which results in a lower capacitance density between the back gate and the Graphene layer 102.

Referring back to FIGS. 3 and 4 and expressions (1)-(2), these figures and expressions represent top gate response. However, similar conductivity curves exist for back-gate voltage. Typically, the top gate dielectric is thinner so a lower voltage change is required for a same change in conductivity, as compared to back gate response. In this embodiment, the top gate only encompasses the middle channel part; therefore it affects conductivity of only the channel and does not change the contact resistance (Rcnt). Therefore, top gate voltage modulation will typically be used because it requires a lower voltage amplitude swing. However, the back-gate provides another control that may be used to mitigate one of the imperfections, such as a shift of the conductivity or sensitivity curve from center (zero voltage bias, Dirac voltage).

Figure 6:
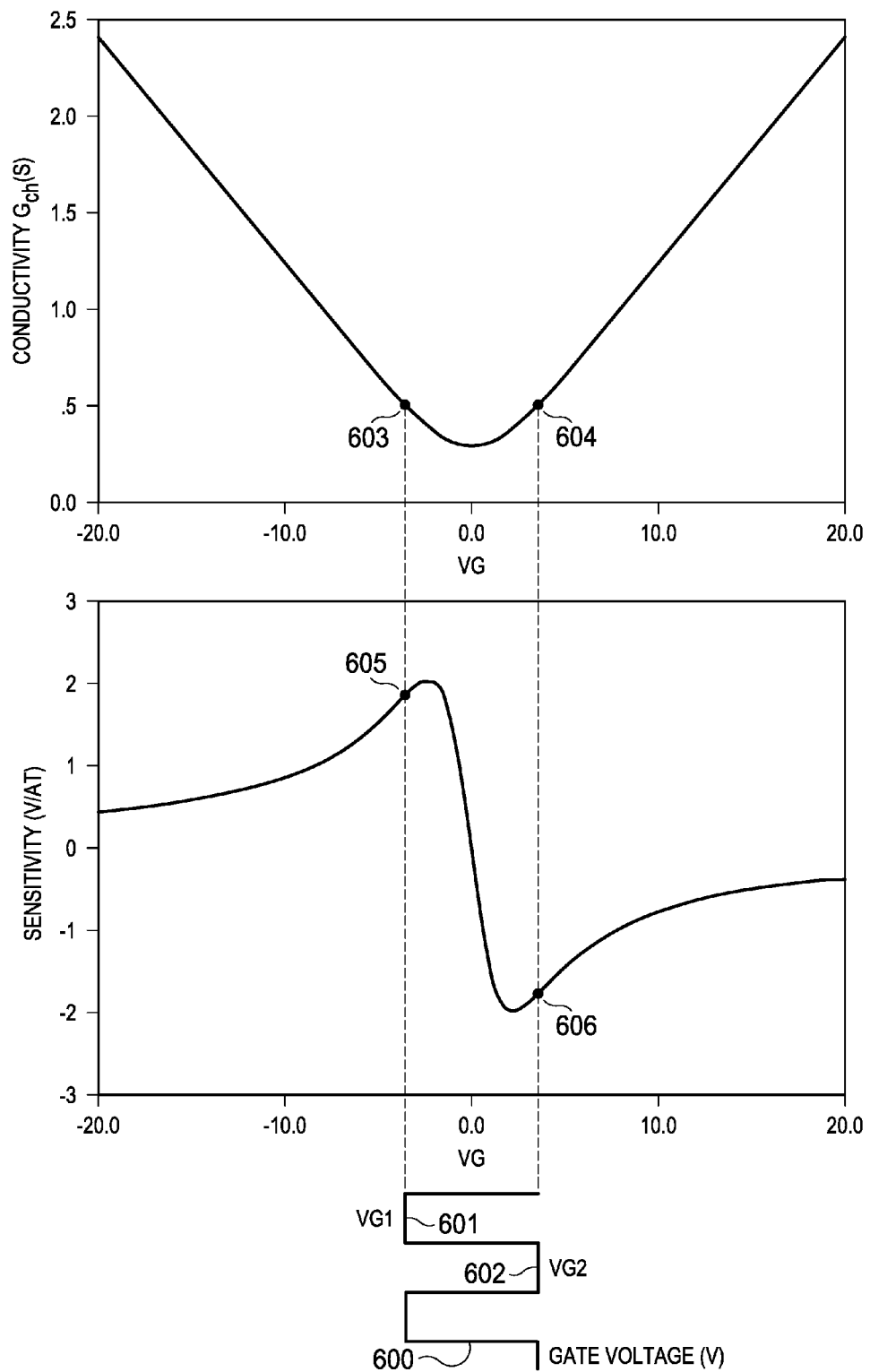
FIG. 6 is a plot illustrating modulation of the gate voltage of a GHS.

FIG. 6 is a plot illustrating modulation of the top gate voltage of a GHS device, such as GHS 100 in FIG. 1. In another embodiment, a similar response may be obtained by modulating the back gate. The amplitude of the gate voltage 600 may be modulated between a negative voltage amplitude VG1 601 and a positive voltage amplitude VG2 602 to switch between two equal conductivity states 603, 604, as illustrated by expression (3).

Figure 7:
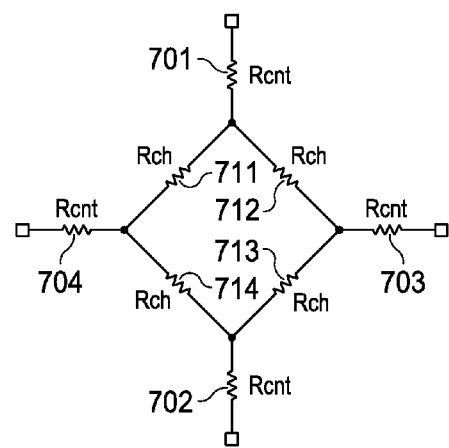
FIG. 7 is an illustration of an equivalent electrical model of a GHS.

FIG. 7 is an illustration of an equivalent electrical model of a GHS. This model includes channel resistance 711-714 and contact resistance 701-704. As mentioned before, offset voltage in a Hall sensor depends on the bias current mismatch in the resistors 711-714 of the Wheatstone bridge electrical model of the Hall sensor. For GHS the offset depends not only on the channel resistance and channel geometry mismatch, but also on the contact resistance. Contact resistance is a significant part of the overall resistance in GHS for the state-of-the-art contact resistance; see, e.g. "A Study on Graphene-Metal Contact", Wenjun Liu et al. The offset voltage is thus given by expression (4). The resistor mismatch is a function of contact resistance (Rcnt), channel conductivity (Gch) and device geometry mismatch factor (F). The GHS structure with top gate only over the channel part does not change contact resistance with gate voltage modulation and device geometry mismatch also is unaffected by gate voltage. This results in equal offset voltages 605, 606 at each state, as illustrated by expression (5). For these two states, sensitivity changes sign, as illustrated by expression (6).

$$G_{ch}(V_{G1})=G_{ch}(V_{G2}) \quad (3)$$

$$V_{off}(V_G)=I_{bias}f(R_{cnt},G_{ch}(V_G),F) \quad (4)$$

$$V_{off}(V_{G1})=V_{off}(V_{G2}) \quad (5)$$

$$S_I(V_{G1})=-S_I(V_{G2}) \quad (6)$$

Figure 8A:
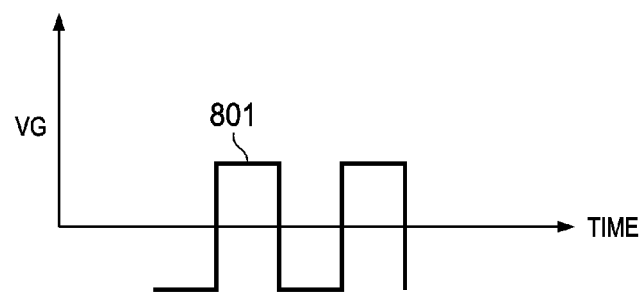
FIGS. 8A-8D are plots illustrating operation of a GHS.
Figure 8B:
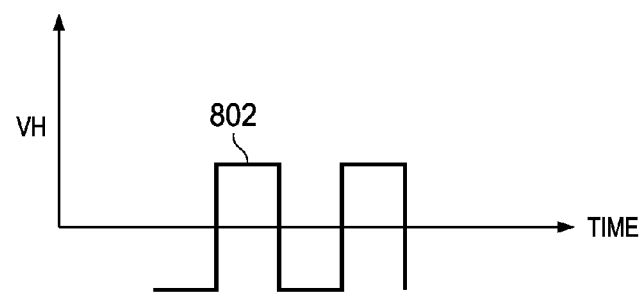
Figure 8C:
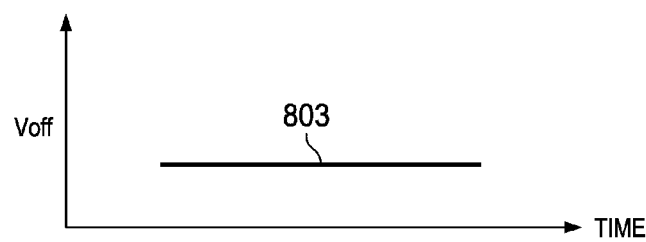
Figure 8D:
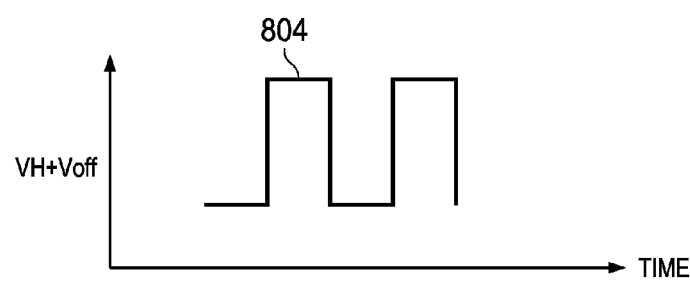

FIGS. 8A-8D are plots illustrating operation of the GHS of FIG. 6. Plot line 801 of FIG. 8A illustrates gate voltage modulation, similar to plot 600 of FIG. 6. Plot line 802 of FIG. 8B illustrates the Hall output voltage for a selected magnetic field strength in response to the modulated gate voltage 801. Plot line 803 of FIG. 8C illustrates the offset voltage that results for each of the two states of gate modulation. Plot line 804 of FIG. 8D illustrates the combined Hall and offset voltages that would be measured at the output contacts of the GHS.

Figure 9:
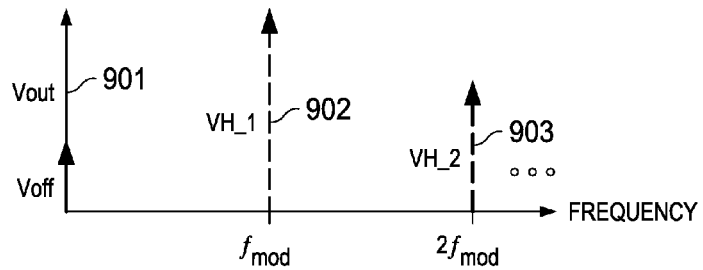
FIG. 9 shows the frequency domain representation of output of the GHS of FIG. 6.

FIG. 9 is a plot illustrating a frequency domain analysis of plot line 804 of FIG. 8D. There is a DC component 901 that represents the static offset voltage and a Hall voltage component 902 at the frequency of the modulated gate voltage. There may be also be Hall voltage harmonics of the modulation frequency as indicated at 903. The Hall voltage component 902 may be recovered using known or later developed signal conditioning techniques, such as synchronous demodulation, bandpass filtering, Fast Fourier Transforms (FFT), etc.

The modulation frequency of the gate voltage may be up to 100 MHz, or more, depending on the configuration of the GHS. This allows rapidly changing magnetic fields to be tracked, up to the frequency of the modulation. In prior devices that use current spinning to mitigate offset voltage, the frequency is limited to 100 kHz to 1 MHz due to the bandwidth limitation of semiconductor Hall devices.

Figure 10A:
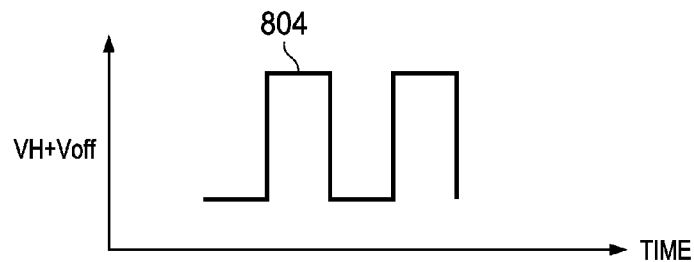
FIGS. 10A-10D are plots illustrating demodulation of the output signal of the GHS of FIG. 6.
Figure 10B:
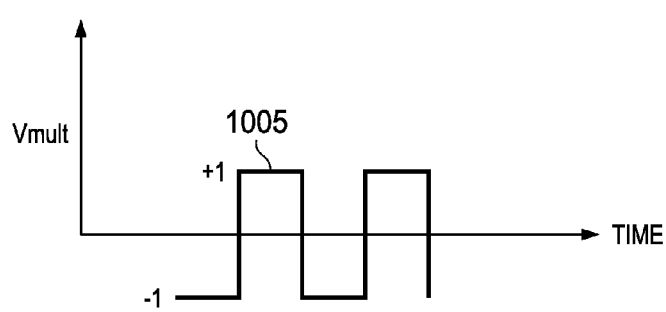
Figure 10C:
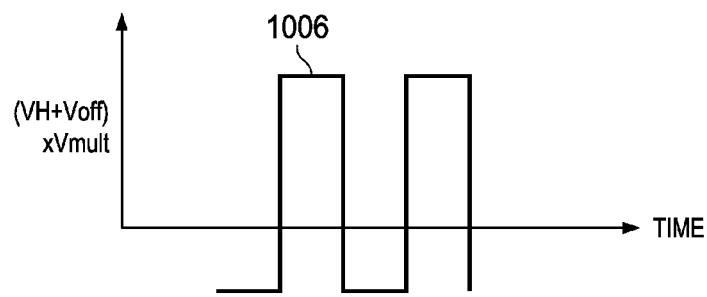

FIGS. 10A-10D are plots illustrating demodulation of the output signal of the GHS of FIG. 6 after performing signal conditioning to remove the offset voltage. Plot line 804 in FIG. 10A is the same as plot line 804 of FIG. 8D and represents the combined Hall and offset voltage signal that would be measured at the output contacts of the GHS. Plot line 1005 of FIG. 10B represents a demodulating waveform that may be used to demodulate signal 804. Plot line 1006 of FIG. 10C represents the signal after multiplication (mixing) of the GHS output signal 804 and the demodulation signal 1005.

Figure 10D:
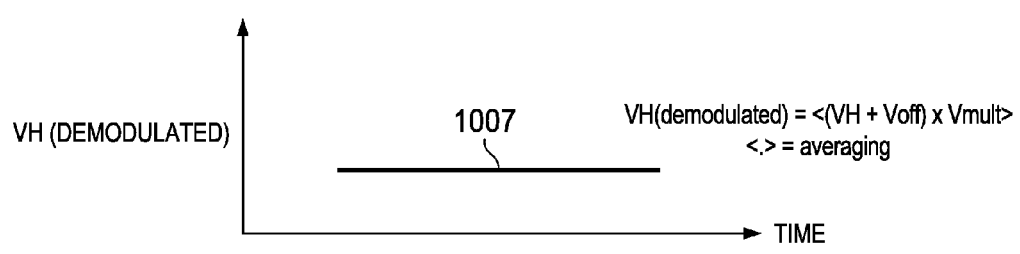

Plot line 1007 of FIG. 10D illustrates a Hall voltage obtained by averaging mixed signal 1006, which is the same result that may be obtained by demodulation and filtering of mixed signal 804. This provides a signal that has an amplitude equal to the amplitude of Hall voltage 802, referring back to FIG. 8B, in which the offset voltage has been successfully removed from the measured signal. Signal 1007 now correctly represents the magnitude of a magnetic field sensed by the GHS.

Figure 11:
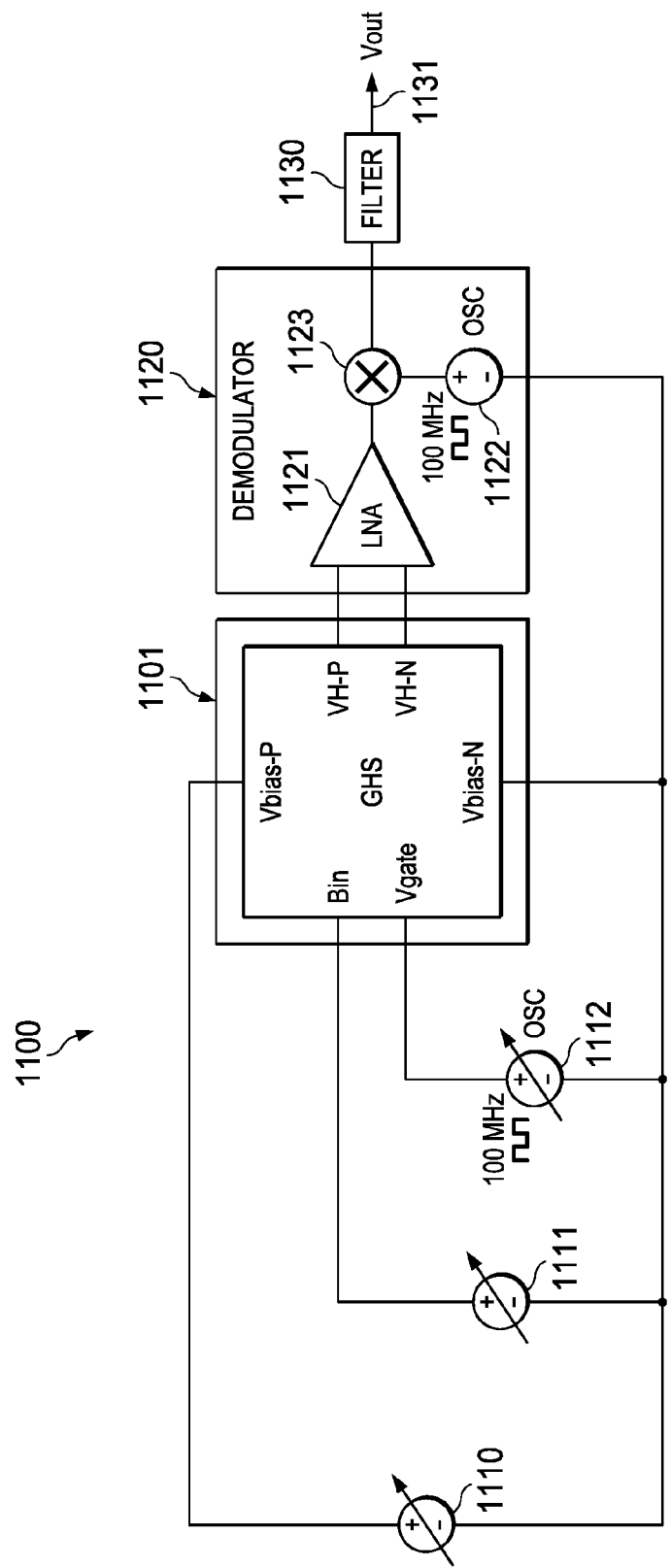
FIG. 11 is a block diagram of an exemplary modulated gate GHS.

FIG. 11 is a block diagram of an exemplary modulated gate GHS system 1100. GHS device 1101 may be similar to GHS 100 from FIG. 1, for example. Bias voltage supply 1110 is configured to provide a steady bias current through the channel of GHS 1101. Back gate bias supply 1111 is configured to provide a bias voltage to the back gate of GHS 1101. Bias supplies 1110, 1111 may be variable or fixed, depending on the applications. In some applications, control logic may be provided to control the voltage level provided by bias voltage supplies 1110, 1111.

Oscillator circuit 1112 is configured to provide a modulated front gate voltage to GHS 1101. Oscillator 1112 may be configured to provide a square wave (or almost square or other periodic) signal having a frequency of 100 MHz, for example. The amplitude of the gate voltage signal is selected to operate in the ambipolar region of GHS 1101, as illustrated in FIG. 8, for example.

Demodulator circuit 1120 receives the modulated output of GHS 1101. Low noise amplifier (LNA) 1121 amplifies the measured signal that contains both the Hall voltage and the DC offset voltage. As mentioned above, one way to recover the Hall voltage from the modulated signal is to perform synchronous demodulation. This is a process similar to that used in an AM (amplitude modulated) radio or homodyne RF (radio frequency) receiver. Demodulation oscillator 1122 (or even output of 1121) provides a 100 MHz signal that is mixed with the modulated Hall output signal by mixer 1123. The output of mixer 1123 may then be filtered by low pass filter (LPF) 1130 to produce a conditioned output signal 1131, as illustrated in FIG. 10D, for example.

Figure 12:
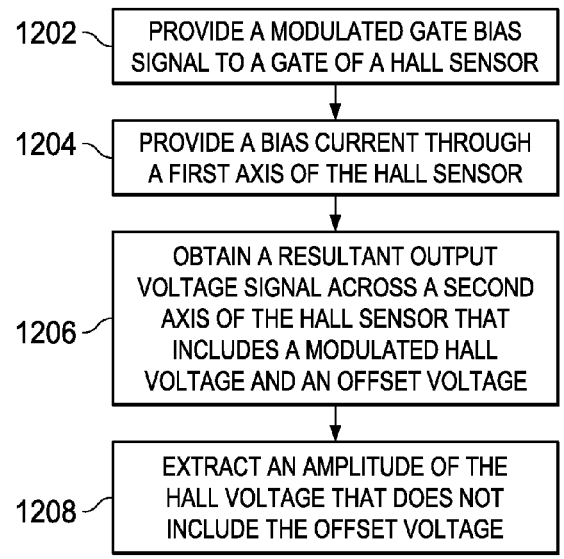
FIG. 12 is a flow chart illustrating operation of a GHS according to FIG. 8.

FIG. 12 is a flow chart illustrating operation of a GHS according to FIG. 8. As disclosed in more detail above, a GHS device, such as GHS 100 in FIG. 1, may be provided 1202 with a modulated gate bias signal. As described with regard to FIG. 8, the signal may be a square wave having a frequency in the range of 1-100 MHz, or higher. The amplitude of the gate voltage may be modulated between a negative voltage amplitude VG1 and a positive voltage amplitude VG2 to switch between two equal conductivity states as illustrated by expression (4) which results in equal offset voltages at each state, as illustrated by expression (5).

A bias current is provided 1204 through one axis of the GHS. A resultant output voltage may then be obtained 1206 across a second axis of the GHS. As described above in more detail, the resultant output voltage will contain a Hall voltage that is modulated at the frequency rate of the modulated gate bias signal along with an offset voltage that results from non-idealities within the Graphene Hall sensor.

The resultant signal may then be conditioned to extract 1208 an amplitude of the Hall voltage that does not include the offset voltage. The conditioned signal will then provide a more accurate representation of the strength of any magnetic field that is penetrating the GHS. The signal conditioning may be done by various known or later developed techniques, such as: performing a bandpass filter of the resultant voltage signal, performing a synchronous demodulation of the resultant signal, filtering the demodulated signal, converting the resultant signal to a digital representation, and performing an FFT operation, etc.

System Example

Figure 13:
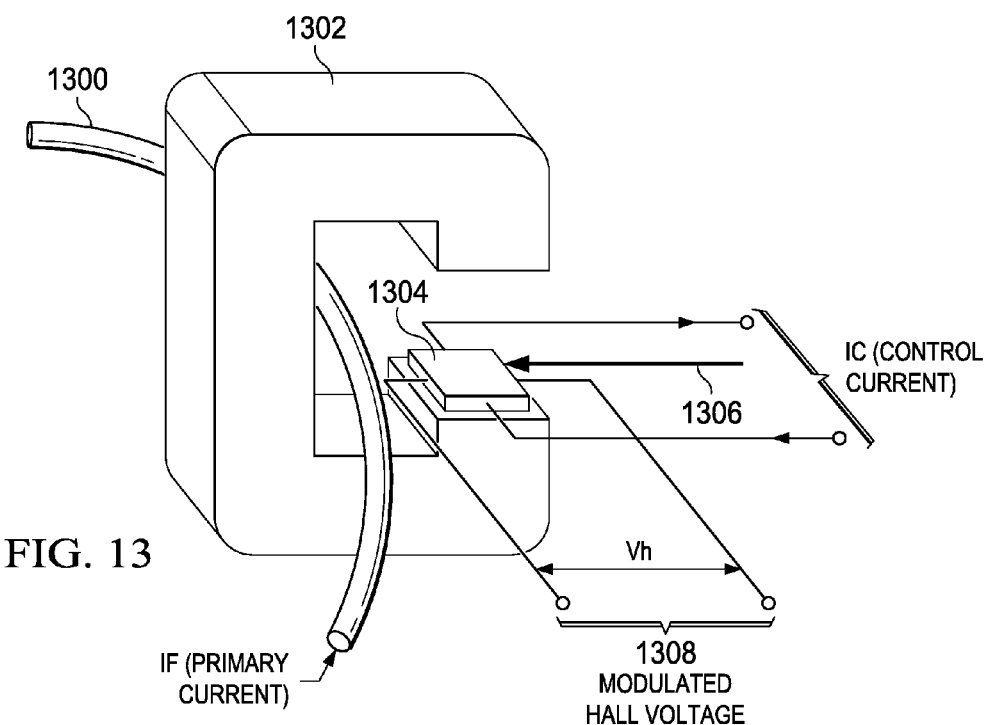
FIGS. 13 and 14 are exemplary illustrations of systems that may include a GHS.
Figure 14:
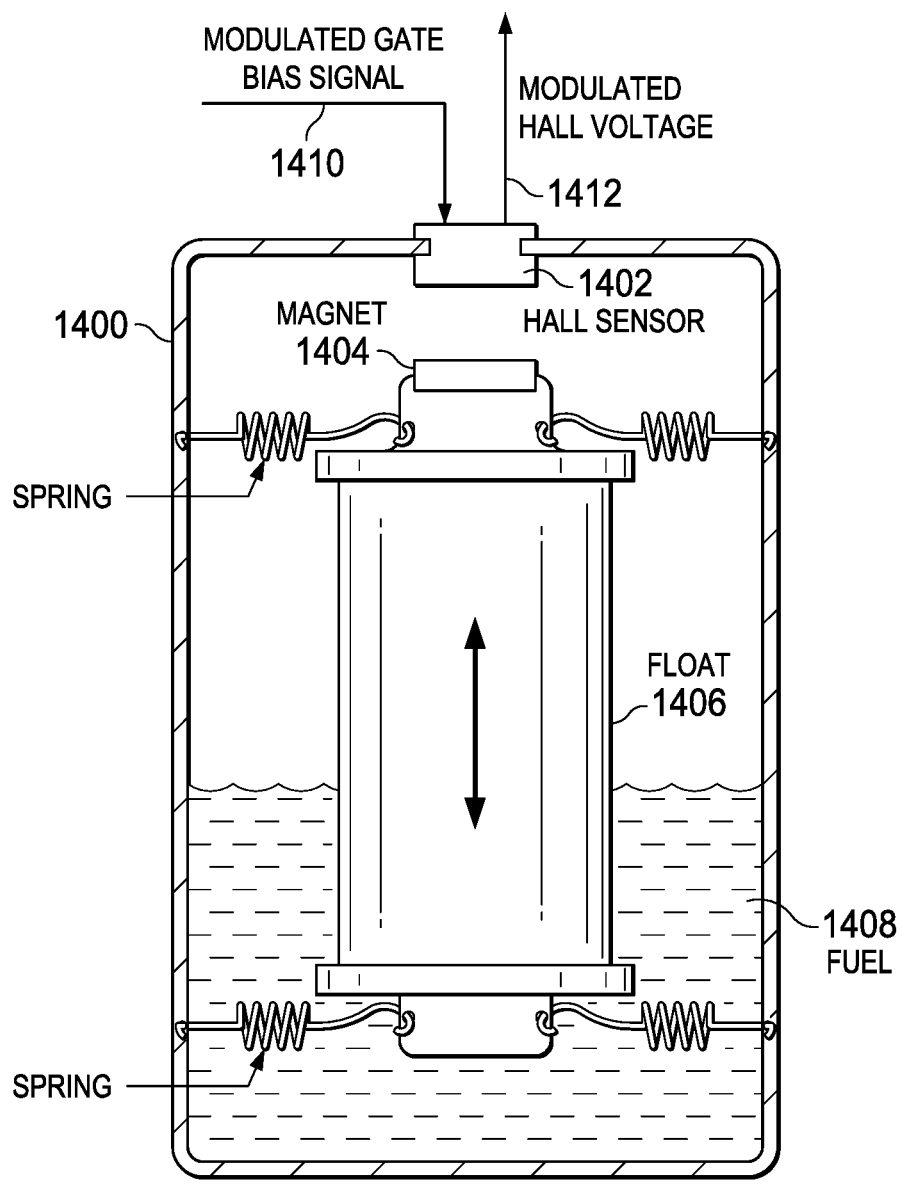

FIGS. 13 and 14 are exemplary illustrations of systems that may include a GHS. FIG. 13 illustrates a system that includes a current carrying wire 1300. It is well known that a magnetic field surrounds a current carrying field. A flux core 1302 may be placed around the wire to direct the magnet flux through a region in which a GHS 1304 is located. By providing a modulated gate bias signal 1306 and conditioning the resultant modulated Hall voltage 1308, an accurate determination of the current flowing through wire 1300 may be made.

FIG. 14 is an illustration of an exemplary tank 1400 that may contain varying amounts of a liquid 1408, such as fuel for an automobile or truck, for example. A GHS 1402 is mounted in an upper region of the tank. A float assembly 1406 is fitted with a magnet that rises and falls with the level of the liquid. The float may be constrained by springs, for example, to keep magnet 1404 aligned with GHS 1402. In another embodiment, a float may be mounted on an arm that pivots within the tank and moves the magnet in relation to GHS 1402 in response to liquid level, for example. By providing a modulated gate bias signal 1410 and conditioning the resultant modulated Hall voltage 1412, and accurate determination of the level of liquid 1408 may be made.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, while a cross shaped Graphene device is illustrated herein, other graphene element shapes may be patterned, such as an octagon or substantially octagonal, a triangle or substantially triangular, a quatrefoil or substantially quatrefoil shaped, a circle or substantially circular shape, etc. Similarly, depending on the geometry of graphene layer, the number of contact pads and corresponding wires may be altered to fit a given application.

In another embodiment, adaptive logic may be provided to control the back gate bias in order to mitigate effects such as Impurity density that do not achieve a low conductivity point or shift a zero sensitivity point; a non-zero Dirac voltage that shifts the lowest conductivity point and shifts the zero sensitivity point; and unequal mobility of electrons and hole that produces conductivity different for the two sides and/or sensitivity different for the two sides.

The graphene layer may be formed by various processes, such as by reduction from methane and grown epitaxially on top of the dielectric oxide. An older process produces a layer of graphene by a micromechanical cleavage technique, sometimes referred to as the "Scotch tape" technique. Other known or later developed techniques may be used to form the Graphene layer.

The techniques described in this disclosure may be implemented in hardware, software, firmware, or any combination thereof. For example, the demodulation process may be performed in software. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method of operating a graphene Hall sensor, the method comprising:
   providing a modulated gate signal to a first gate of the graphene Hall sensor (GHS), in which the modulated gate signal alternates at a modulation frequency between a first voltage that produces a first conductivity state in the GHS and a second voltage that produces a second conductivity state in the GHS, the second conductivity state having a same conductivity as the first conductivity state;
   providing a bias current through a first axis of the GHS;
   obtaining a resultant output voltage signal across a second axis of the Hall sensor that includes a modulated Hall voltage and an offset voltage, in which the Hall voltage is modulated at the modulation frequency; and
   extracting an amplitude of the Hall voltage that does not include the offset voltage.

2. The method of claim 1, in which extracting the amplitude of the Hall voltage is performed by synchronous demodulation of the output voltage signal.

3. The method of claim 1, in which extracting the amplitude of the Hall voltage is performed by bandpass filtering the output voltage signal.

4. The method of claim 1, in which extracting the amplitude of the Hall voltage is performed using a Fast Fourier Transform.

5. The method of claim 1, in which the modulated gate signal is modulated at a frequency in a range of 10-100 MHz.

6. The method of claim 1, in which the first gate is a top gate and the GHS has a back gate, in which the modulated gate signal is provided to the top gate and an adaptively controlled voltage is applied to the back gate.

7. The method of claim 1, in which the first gate is a back gate, in which the modulated gate signal is provided to the back gate.

8. The method of claim 1, in which the modulated gate signal is modulated between a negative voltage amplitude VG1 and a positive voltage amplitude VG2 to cause the GHS to switch between two equal conductivity states that result in equal offset voltages at each state.

9. A Hall effect sensor system comprising:
a graphene Hall sensor (GHS) having a graphene layer with a first pair of contacts configured to provide a bias current through a first axis of the graphene layer and a second pair of contacts configured to measure a Hall effect voltage across a second axis of the graphene layer and a conductive first gate spaced apart from the graphene layer by a dielectric, in which the Hall effect voltage includes an offset voltage;
an oscillator coupled to the gate configured to provide a modulated gate signal that alternates at a modulation frequency between a first voltage that produces a first conductivity state in the GHS and a second voltage that produces a second conductivity state in the GHS, the second conductivity state having a same conductivity as the first conductivity state; and
a demodulator coupled to receive the Hall effect voltage configured to extract an amplitude of the Hall effect voltage that does not include the offset voltage.

10. The system of claim 9, in which the first gate is a top gate that covers only a channel portion of the GHS and does not cover the first pair of contacts and the second pair of contacts.

11. The system of claim 9, in which the demodulator includes a local oscillator coupled to a mixer, and in which the second pair of contacts are coupled to the mixer via a low noise amplifier.

12. The system of claim 9, in which the demodulator includes a bandpass filter.

13. The system of claim 9, in which the demodulator includes an analog to digital converter and a processor configured to perform a Fast Fourier Transform of the Hall Effect voltage.

14. The system of claim 9, in which the oscillator is configured to provide the modulated gate signal with a modulation frequency in a range of 10-100 MHz.

15. The system of claim 9, in which the first gate is a top gate and the GHS has a back gate, in which the modulated gate signal from the oscillator is applied to the top gate and an adaptively controlled voltage source is applied to the back gate.

16. The system of claim 9, in which the first gate is a back gate, in which the modulated gate signal from the oscillator is applied to the back gate.

17. The system of claim 9, further including a fuel tank, in which the GHS is coupled to the fuel tank.

18. The system of claim 9, in which the GHS is coupled to flux core that surrounds a conductive wire.

19. A method of operating a Hall effect sensor, the method comprising:
applying an oscillating gate voltage at a modulation frequency to a first gate of the Hall effect sensor, wherein the gate voltage oscillates between a first voltage that produces a first conductivity state in the Hall effect sensor and a second voltage that produces a second conductivity state in the Hall effect sensor, the second conductivity state having a same conductivity as the first conductivity state;
conducting a bias current through a first axis of the Hall effect sensor;
producing an output voltage signal across a second axis of the Hall effect sensor that includes a Hall voltage modulated at the modulation frequency and an offset voltage; and
extracting an amplitude of the Hall voltage that does not include the offset voltage.

20. The method of claim 19, comprising:
mixing an oscillator voltage at the modulation frequency with the modulated Hall voltage to produce a demodulated output signal; and
filtering the demodulated output signal.

* * * * *